United States Patent [19]

Wang

[11] Patent Number: 5,712,567
[45] Date of Patent: Jan. 27, 1998

[54] METHOD FOR COMPENSATING A SENSITIVITY PROFILE OF AN ANTENNA ARRANGEMENT OF A NUCLEAR MAGNETIC RESONANCE APPARATUS

[75] Inventor: Jianmin Wang, Erlangen, Germany

[73] Assignee: Siemens Aktiengesellschaft, Munich, Germany

[21] Appl. No.: 669,096

[22] Filed: Jun. 26, 1996

[30] Foreign Application Priority Data

Jul. 21, 1995 [DE] Germany .................. 195 26 778.8

[51] Int. Cl.$^6$ ............................................. G01V 3/00
[52] U.S. Cl. ................................... 324/307; 324/309
[58] Field of Search ............................. 324/307, 309, 324/312, 314, 318, 322

[56] References Cited

U.S. PATENT DOCUMENTS

| | | | |
|---|---|---|---|
| 4,649,346 | 3/1987 | Yeung et al. | 324/312 |
| 4,746,860 | 5/1988 | Satoh | 324/309 |
| 4,777,438 | 10/1988 | Holland | 324/318 |
| 4,825,162 | 4/1989 | Roemer et al. | 324/312 |
| 4,947,121 | 8/1990 | Hayes | 324/322 |

FOREIGN PATENT DOCUMENTS 0 285 862   3/1988   European Pat. Off. .

OTHER PUBLICATIONS

"The NMR Phased Array," Roemer et al., Magnetic Resonance in Medicine, vol. 16 (1990) pp. 192–225.

*Primary Examiner*—Louis M. Arana
*Attorney, Agent, or Firm*—Hill, Steadman & Simpson

[57] ABSTRACT

In a method for compensating a sensitivity profile of an antenna arrangement which is visibly manifested in a nuclear magnetic resonance image, respective source nuclear magnetic resonance images of the same image subject and respectively composed of picture elements are registered with two antenna sub-arrangements arranged opposite one another, and brightness values are allocated to the picture elements of the source nuclear magnetic resonance images dependent on the image subject. A geometrical average of the brightness values of picture elements of the two source nuclear magnetic resonance images respectively corresponding to one another is formed. Corresponding picture elements of a single compensated nuclear magnetic resonance image are formed dependent on the geometrical averages.

7 Claims, 5 Drawing Sheets

METHOD FOR COMPENSATING A SENSITIVITY PROFILE OF AN ANTENNA ARRANGEMENT OF A NUCLEAR MAGNETIC RESONANCE APPARATUS

BACKGROUND OF THE INVENTION

1. Field of the Invention

The invention is directed to a method for compensating a sensitivity profile of an antenna arrangement of a nuclear magnetic resonance apparatus, the sensitivity profile, if not compensated, being visibly manifested that is visible in a nuclear magnetic resonance image.

2. Description of the Prior Art

It is known to produce an image of a source subject using a magnetic resonance imaging apparatus by obtaining respective source nuclear magnetic resonance images, composed of picture elements, of the same image subject with two sub-arrangements of antennas arranged disposed opposite one another. Brightness values are allocated to the picture elements of the source magnetic resonance images dependant on the image subject in a manner to produce an enhanced single image from the two source images.

Local antennas are particularly employed for the reception of nuclear magnetic resonance signals in diagnostic nuclear magnetic resonance apparatus because they supply a better signal-to-noise ratio compared to whole body antennas. It is thereby accepted that the sensitivity of the antennas is non-uniform. The intensity of the reception signal decreases with the distance of the signal source, i.e. the atomic nuclei emitting the nuclear magnetic resonance signals. The intensity drop increases as the diameter of the local antenna decreases. Without further measures, this phenomenon becomes manifested in nuclear magnetic resonance images derived from local antennas by virtue of such images being visibly nonhomogeneous, i.e. portions of the examination region that are located in the proximity of the local antenna are reproduced with greater emphasis than those at a larger distance.

The sensitivity profile of the antenna arrangement visible in the nuclear magnetic resonance image can be compensated or the nuclear magnetic resonance image can be homogenized when the sensitivity profile or the sensitivity distribution of the antenna arrangement is known. The sensitivity profile can be determined using a uniform phantom. The position of the section plane (slice) with reference to the antenna arrangement, however, must be taken into consideration in the compensation.

A comparatively simple known method calculates the sensitivity profile of the coil from the very images to be compensated. The method assumes that the image brightness in tomograms varies greatly from patient to patient or test subject to test subject, from picture element to picture element or pixel to pixel, whereas brightness differences due to a non-uniform sensitivity distribution of the local antenna vary only slightly. The sensitivity profile of the local antenna can be filtered out of the registered nuclear magnetic resonance image with a low-pass filter and can be employed for the compensation.

An advantage of this method is that it can be employed for arbitrary antenna arrangements, slice directions and fields of view (FOV). A disadvantage, however, is that slight brightness differences that derive from the image subject may possibly be also filtered out. It is therefore necessary to carefully select the filter characteristic so that an optimally large part of the sensitivity profile of the local antenna and optimally little image information deriving from the image subject are compensated/affected. It would also be meaningful in this context to vary the filter characteristic dependent on the slice position and slice direction as well as on the FOV; this, however, is difficult to realize in practice.

An article by Roemer et al., "The NMR Phase Array", Magnetic Resonance in Medicine, Vol. 16, 1990, pages 192–225, discloses the use of antenna arrays having individual antennas arranged next to one another and magnetically decoupled from one another in order to obtain noise-reduced magnetic resonance images. The sum of the squares of the brightness values of corresponding picture elements of the nuclear magnetic resonance signals registered with the individual antennas of the array is formed and the square root of the squares sum is subsequently formed. The brightness values calculated in this way from the individual images yield a noise-reduced nuclear magnetic resonance image.

SUMMARY OF THE INVENTION

An object of the present invention is to provide a method for compensating a sensitivity profile of an antenna arrangement visible in a nuclear magnetic resonance image that enables such compensation independently of the position and alignment of the nuclear magnetic resonance image and without loss of image information.

This object is achieved in a method wherein two source images are produced as described above and wherein geometrical averages are respectively formed from the brightness values of corresponding picture elements of the two source nuclear magnetic resonance images, and the geometrical averages are respectively allocated as brightness values to corresponding picture elements of a single compensated nuclear magnetic resonance image.

The invention is based on the perception that the sensitivity profile of a local antenna exhibits a high dependency on distance in the axial direction of the antenna, whereas the sensitivity profile in the transverse direction—apart from a greatly increased sensitivity in the immediate proximity of the antenna conductors—is rather uniform. As used herein, the axial direction is the direction of the magnetic axis of the antenna arrangement. The sensitivity drop in the axial direction is approximately proportional to an e-function. When the image data acquired with antenna sub-arrangements arranged opposite one another are inventively combined, the differently emphasized regions just cancel due to multiplication of the brightness values of corresponding picture elements of the two source nuclear magnetic resonance images. The sensitivity profile of the antenna arrangement can be compensated and the nuclear magnetic resonance image can be homogenized on this basis.

In one embodiment the antenna sub-arrangements arranged opposite one another each formed by a plurality of individual antennas arranged next to one another, an individual nuclear magnetic resonance image of the same image subject is registered with each individual antenna, and source nuclear magnetic resonance images with an improved signal-to-noise ratio are formed from the individual nuclear magnetic resonance images of the individual antennas belonging to a respective antenna sub-arrangement. The compensated nuclear magnetic resonance image thus also exhibits lower noise components.

In another embodiment the picture elements of the source nuclear magnetic resonance images are formed from corresponding picture elements of the individual nuclear magnetic resonance images by first forming the sum of the squares and the square root of the squares sum is then taken. This relatively simple method for improving the signal-to-noise ratio is especially suitable when a weak noise correlation exists between the individual antennas of the antenna sub-arrangements.

In another embodiment an intermediate image is formed from the two source nuclear magnetic resonance images, by first forming the sum of the squares of corresponding picture elements and the square root of the squares sum is then taken, the intermediate image and the compensated nuclear magnetic resonance image are subjected to low-pass filtering, a noise-reduced image of the sensitivity distribution is formed by the low-pass filtered, intermediate image to the low-pass filtered, compensated nuclear magnetic resonance image, and a noise-reduced, compensated nuclear magnetic resonance image is formed by referencing the intermediate image to the noise-reduced image of the sensitivity distribution.

In another version of the last mentioned embodiment an intermediate image is formed from the picture elements of the two source nuclear magnetic resonance images by first forming the sum of the squares of corresponding picture elements and the square root of the squares sum is then taken, an image of a sensitivity distribution is then formed by referencing the intermediate image to the compensated nuclear magnetic resonance image, a noise-reduced image of the sensitivity distribution is formed by low-pass filtering the image of the sensitivity distribution, and a noise-reduced, compensated nuclear magnetic resonance image is formed by referencing the intermediate image to the noise-reduced image of the sensitivity distribution. Compared to the embodiment described immediately above, only one image is low-pass filtered in this version.

A further noise reduction in the compensated nuclear magnetic resonance image can be achieved with the two embodiments described above. The frequency response of the low-pass filter can be selected such that only high-frequency noise parts are filtered out; the sensitivity profile itself is not modified. By contrast to the known method initially described, it is not critical in the inventive method that image information is also filtered out because the filtered images are employed in the inventive method in order to acquire the sensitivity distribution of the antennas.

DESCRIPTION OF THE PREFERRED EMBODIMENTS

Figure 1:
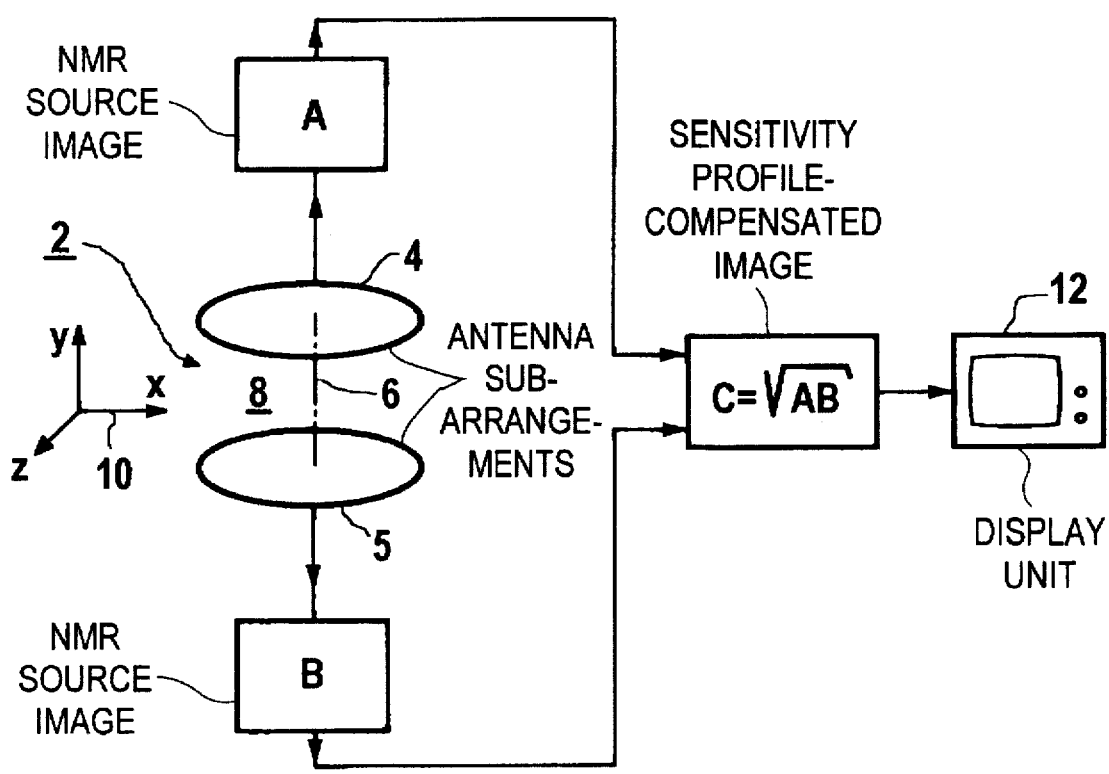
FIG. 1 is a schematic illustration of the basic steps of the compensation method of the invention.

FIG. 1 schematically shows an antenna arrangement 2 of a diagnostic nuclear magnetic resonance apparatus. The antenna arrangement 2 includes two identically fashioned antenna sub-arrangements 4 and 5 arranged opposite one another. The magnetic axes of the two antenna sub-arrangements 4—symbolized by a dot-dash line—coincide. The magnetic axes 6 are aligned perpendicularly with respect to a main magnetic field (not shown here). The two antenna sub-arrangements 4 and 5 define an examination volume 8 that lies between the two antenna sub-arrangements and into which a patient or a portion of a patient can be introduced.

In a first approximation, the sensitivity of the two antenna sub-arrangements 4 and 5 along the magnetic axis 6 is proportional to an e-function (e=natural logarithm base). In other words, the signal intensity decreases according to an e-function with increasing distance from the signal source—i.e. the location of the excited atomic nuclei. If the origin of an x-y-z coordinate system 10 lies in the center of the antenna sun-arrangement 4 and 5, whereby the magnetic axis 6 coincides with the y-axis, then the sensitivity U in the examination volume 8 for the upper antenna sub-arrangement is approximately proportional to $$U \sim \exp(a\,y)$$

and, for the lower antenna sub-arrangement, the sensitivity U is approximately proportional to $$U \sim \exp(-a\,y).$$

The factor a in the exponent is determined by the shape and size of the antenna sub-arrangements 4 and 5. It is the same for both antenna sub-arrangements 4 and 5 given the same design of the two antenna sub-arrangements 4 and 5.

A source nuclear magnetic resonance image A(i,j) with picture elements arranged rectangular matrix is now produced with the antenna sub-arrangement 4, whereby i, indicates the row number and j the column number. A corresponding source nuclear magnetic resonance image B(i,j) of the same image subject is produced with the lower antenna sub-arrangement 5. A compensated nuclear magnetic resonance image C(i,j) is formed from the source nuclear magnetic resonance images A(i,j) and B(i,j) in that picture elements corresponding to one another, i.e. the picture elements at corresponding locations with the same row and column numberings, are first multiplied with one another. Subsequently, the square root is taken of the respective product. The formation of the compensated nuclear magnetic resonance images can be recited as follows as a mathematical equation:

$$C(i,j) = \sqrt{A(i,j)\,B(i,j)}$$

with $1 \leq i \leq M$ and $1 \leq j \leq N$. In the exemplary embodiment, $M=N=256$.

In other words, a geometrical average is formed from corresponding picture elements of the two source nuclear magnetic resonance images A(i,j) and B(i,j). The geometrical averages form the corresponding picture elements of a single, compensated nuclear magnetic resonance image C(i, j) that is displayed on a display unit 12.

Figure 2:
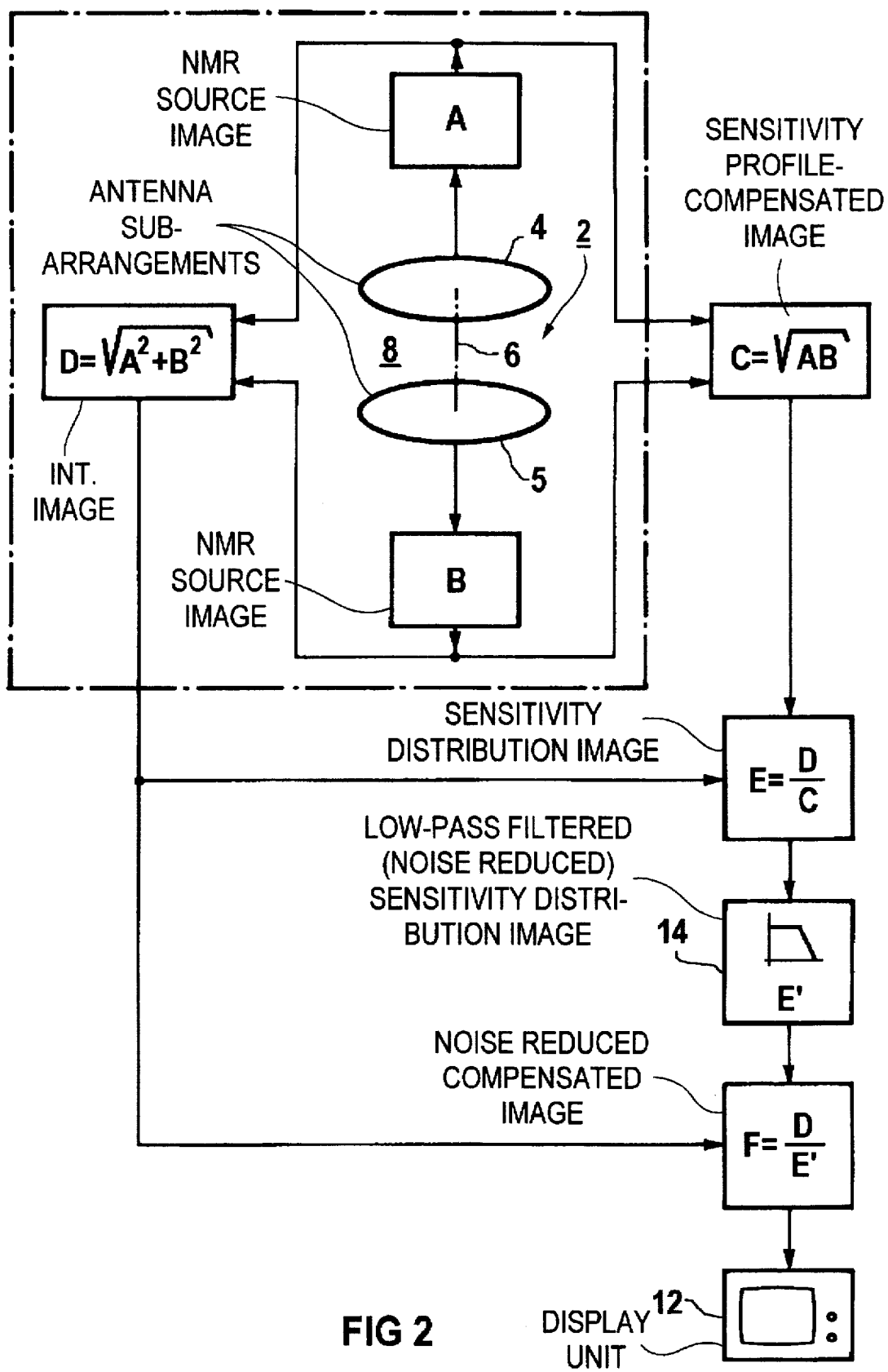
FIG. 2 shows a first alternative embodiment of the inventive method for forming a noise-reduced, compensated nuclear magnetic resonance image.

FIG. 2 shows the basic method steps for generating a compensated nuclear magnetic resonance image in an embodiment that, compared to the basic method according to FIG. 1, generates a noise-reduced, compensated nuclear magnetic resonance image F. The aforementioned compensated nuclear magnetic resonance image C(i,j) is thereby generated from the source nuclear magnetic resonance images A(i,j) and B(i,j) as an intermediate image whose picture elements are generated from corresponding picture elements of the source magnetic resonance images A(i,j) and B(i,j) by forming the geometrical average. A noise-reduced image D(i,j) is likewise generated from the source magnetic resonance images A(i,j) and B(i,j) in that the sum of the squares of the values of the source magnetic resonance images A(i,j) and B(i,j) allocated to the individual picture elements is generated and the square root of the square sum is subsequently taken:

$$D(i,j) = \sqrt{A^2(i,j) + B^2(i,j)}$$

This method for generating a noise-reduced nuclear magnetic resonance image D(i,j) is known from the article by Roemer et al. that has already been cited, however, the sensitivity profile of the antenna arrangement 2 still can be recognized in the noise-reduced intermediate image D(i,j). The fluctuating sensitivity visible in the image therefore must still be compensated. To that end, a sensitivity profile or a sensitivity distribution E(i,j) of the antenna arrangement 2 is formed by referencing the noise-reduced intermediate image D(i,j) to the compensated nuclear magnetic resonance image C(i,j) picture element-by-picture element:

$$E(i,j) = D(i,j)/C(i,j).$$

Fundamentally, the sensitivity distribution is thus already established but the image E(i,j) is also subjected to low-pass filtering in a filter unit 14 in order to generate a noise-reduced sensitivity profile E'(i,j). The noise-reduced and compensated nuclear magnetic resonance image F(i,j) is now calculated by referencing the noise-reduced intermediate image D(i,j) to the low-pass filtered sensitivity profile E'(i,j) picture element-by-picture element:

$$F(i,j) = D(i,j)/E(i,j).$$

The noise-reduced, compensated nuclear magnetic resonance image F(i,j) then proceeds to the display unit 12.

Figure 3:
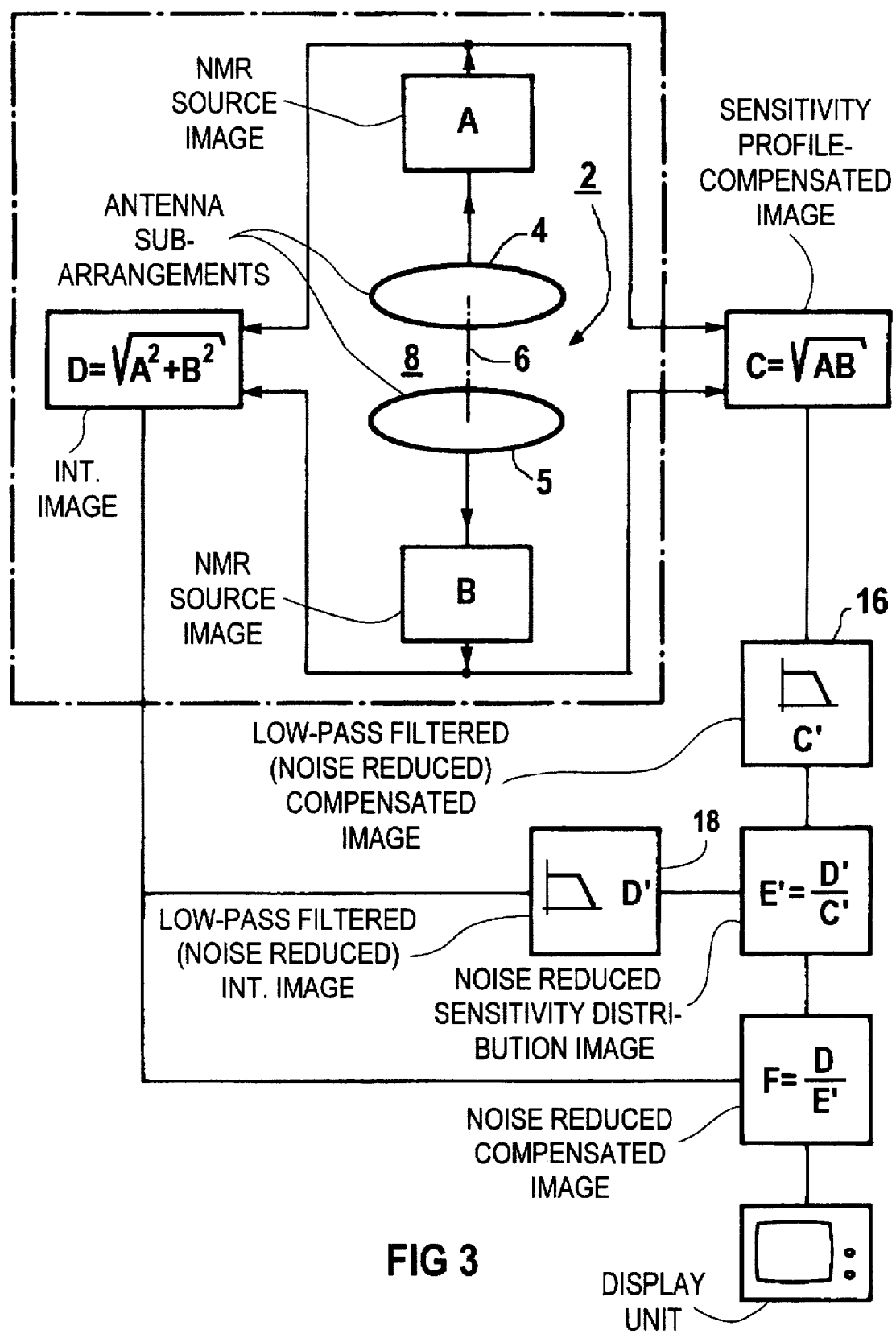
FIG. 3 shows a second alternative embodiment of the inventive method for forming a noise-reduced, compensated nuclear magnetic resonance image.

FIG. 3 shows an embodiment that differs from the embodiment described on the basis of FIG. 2 in that two filter units 16 and 18 are employed the respectively low-pass filter the intermediate image D(i,j) and the compensated nuclear magnetic resonance image D(i,j). As a result, low-pass filtered intermediate images D'(i,j) and C'(i,j) are generated from which the low-pass filtered sensitivity distribution $$E'(i,j) = D'(i,j)/C'(i,j)$$

is formed picture element-by-picture element.

Figure 4:
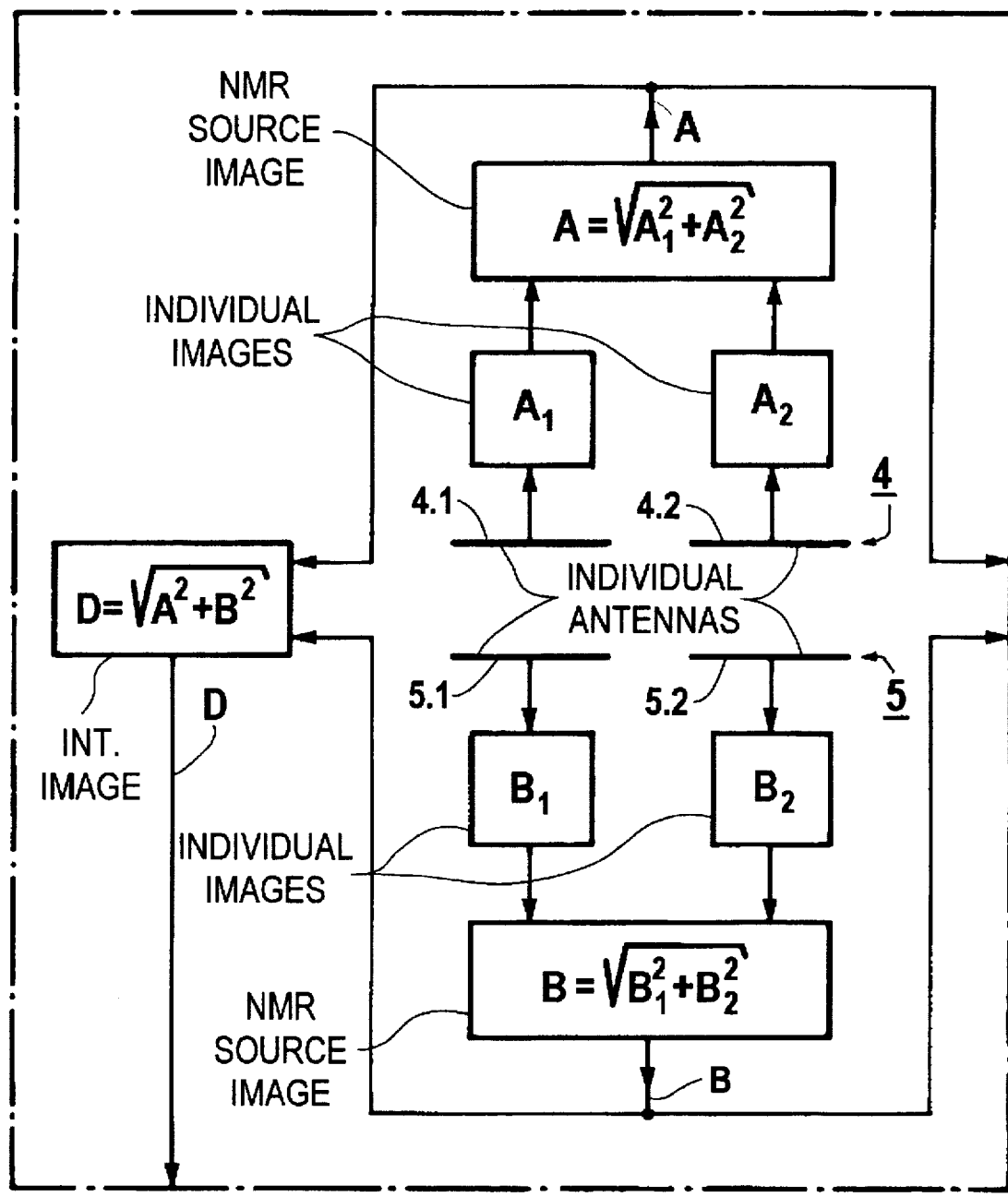
FIG. 4 shows a first realization of the compensation method of the inventive method for an antenna array.
Figure 5:
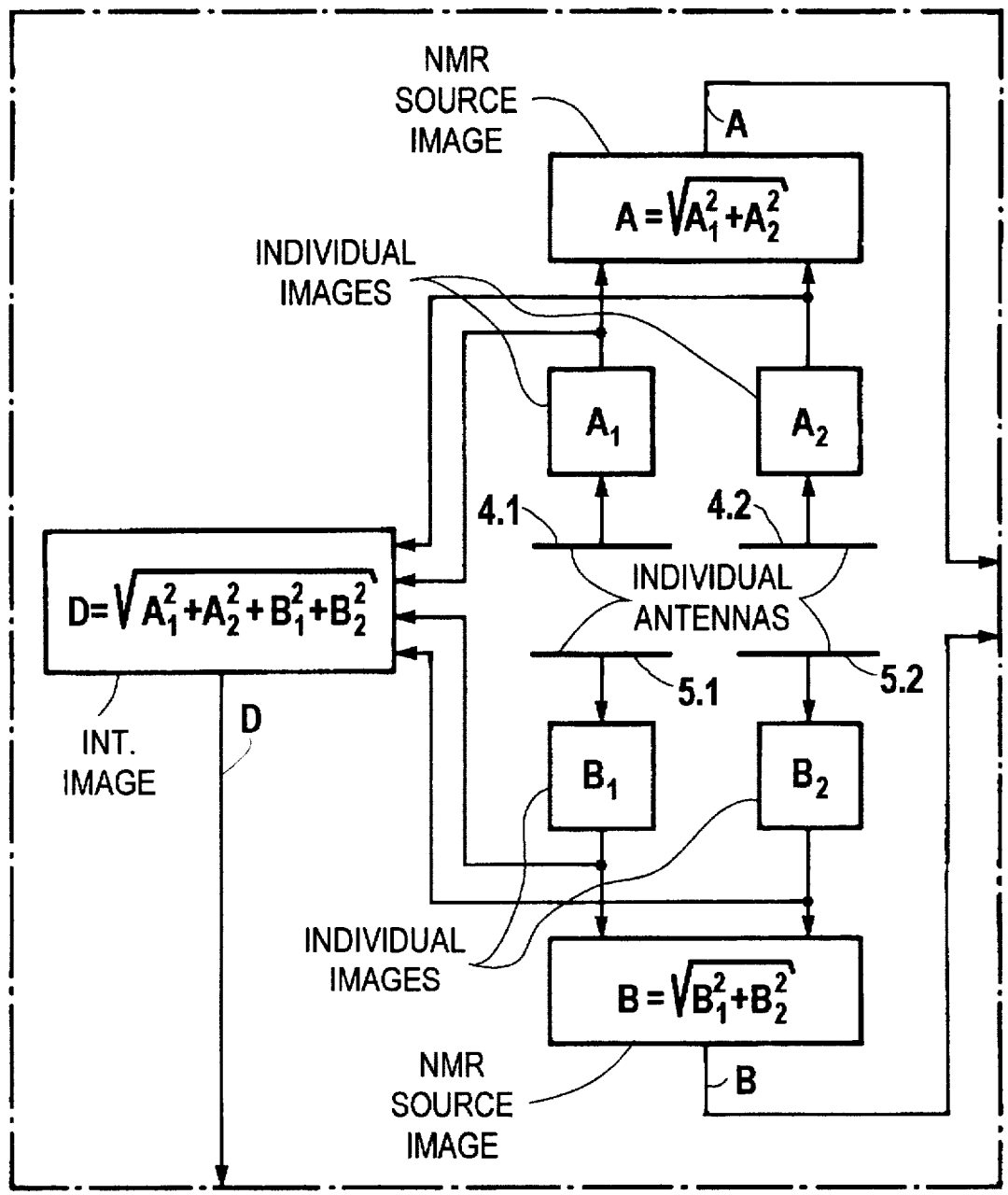
FIG. 5 shows a second realization of the compensation method of the inventive method for an antenna array.

FIGS. 4 and 5 show modifications of the previously described embodiments of the inventive method wherein the antenna sub-arrangements 4 and 5 are each fashioned as an antenna array with individual side-by-side antennas 4.1 and 4.2 or 5.1 and 5.2 are side-by-side. The individual antennas 4.1 and 4.2 as well as 5.1 and 5.2, are respectively substantially completely magnetically decoupled from one another. Respective individual images $A_1(i,j)$, $A_2(i,j)$, $B_1(i,j)$ and $B_2(i,j)$ are generated with the individual antennas 4.1, 4.2, 5.1 and 5.2.

A noise-reduced nuclear magnetic resonance image A(i,j) is formed from the individual images $A_1(i,j)$ and $A_2(i,j)$ by forming the squares sum of the individual images $A_1(i,j)$ and $A_2(i,j)$ and the square root of the squares sum is subsequently formed:

$$A(i,j) = \sqrt{A_1^2(i,j) + A_2^2(i,j)}.$$

Correspondingly, a noise-reduced nuclear magnetic resonance image $$B(i,j) = \sqrt{B_1^2(i,j) + B_2^2(i,j)}$$

is formed from the lower individual images $B_1(i,j)$ and $B_2(i,j)$. The noise-reduced nuclear magnetic resonance images A(i,j) and B(i,j), as already set forth with reference to FIGS. 2 and 3, are then employed to form, the noise-reduced intermediate image D and the homogenized nuclear magnetic resonance image C, that are then further-processed to form the noise-reduced, homogenized nuclear magnetic resonance image F.

FIG. 5 differs from the modification of FIG. 4 in that the noise-reduced intermediate image D is directly generated from the individual nuclear magnetic resonance images $A_1(i,j)$, $A_2(i,j)$, $B_1(i,j)$ and $B_2(i,j)$. This takes place by first forming squares sum of the individual images $A_1(i,j)$, $A_2(i,j)$, $B_1(i,j)$ and $B_2(i,j)$ and the square root of the squares sum is then taken:

$$D(i,j) = \sqrt{A_1^2(i,j) + A_2^2(i,j) + B_1^2(i,j) + B_2^2(i,j)}.$$

The other method steps correspond to the steps already described on the basis of FIG. 4.

A signal-to-noise ratio that is improved further can be achieved when circularly polarized antennas are employed instead of the linearly polarized sub-antennas 4 and 5 or individual antennas 4.1, 4.2, 5.1 and 5.2. Circularly polarized antennas simultaneously receive signals from two directions residing perpendicular to one another that are combined after a phase shift of 90° relative to one another. As explained with reference to the exemplary embodiments, a homogenized nuclear magnetic resonance image can then be generated from the image information received with the circularly polarized antennas.

Although modifications and changes may be suggested by those skilled in the art, it is the intention of the inventor to embody within the patent warranted hereon all changes and modifications as reasonably and properly come within the scope of the inventor's contribution to the art.

I claim as my invention:

1. A method for compensating a sensitivity profile of an antenna arrangement in a nuclear magnetic resonance imaging apparatus, said sensitivity profile being visibly manifested in a nuclear magnetic resonance image produced using said antenna arrangement, and wherein said antenna arrangement includes a first antenna sub-arrangement and a second antenna sub-arrangement disposed opposite said first antenna sub-arrangement, said first and second antenna sub-arrangements defining an examination volume therebetween, said method comprising the steps of:

generating a first nuclear magnetic resonance source image of an examination subject in a position in the examination volume obtained exclusively from signals from said first antenna sub-arrangement, said first source image being composed of pixels having respective brightness values dependent on said examination subject;

generating a second nuclear magnetic resonance source image of the same examination subject in the same position in the examination volume obtained exclusively from signals from said second antenna sub-arrangement, said second source image being composed of pixels having respective brightness values dependent on said examination subject, the pixels in said first source image being correlated in position with the pixels of said second source image;

forming a geometrical average of the respective brightness values of correlated pixels in said first and second source images; and generating a single, compensated nuclear magnetic resonance image of said examination subject composed of a plurality of pixels correlated in position to the pixels of said first and second source images and said pixels in said single, compensated image respectively having brightness values dependent on said geometrical average of the brightness values of the corresponding pixels of said first and second source images.

2. A method as claimed in claim 1, wherein the step of generating said first source image comprises forming said first antenna sub-arrangement of a plurality of individual first antennas disposed next to each other, generating a plurality of first individual nuclear magnetic resonance images of said examination subject in said position in the examination volume respectively using signals obtained exclusively from said first individual antennas, and forming said first source image with an improved signal-to-noise ratio from said first individual images; and wherein the step of generating said second source image comprises forming said second antenna sub-arrangement of a plurality of individual second antennas disposed next to each other, generating a plurality of second individual nuclear magnetic resonance images of said examination subject in said position in the examination volume respectively using signals obtained exclusively from said second individual antennas, and forming said second source image with an improved signal-to-noise ratio from said second individual images.

3. A method as claimed in claim 2 wherein each of said first individual images is composed of a plurality of pixels respectively correlated in position with each of the others of said first individual images, and wherein each of said second individual images is composed of a plurality of pixels respectively correlated in position with each of the others of said second individual images, and wherein:

the step of forming said first source image with an improved signal-to-noise ratio from the individual first images comprises forming a sum of the respective squares of the brightness values of the corresponding pixels for all of said first individual images, and assigning a brightness value to a corresponding pixel in said first source image dependent on the square root of said sum of the squares; and the step of forming said second source image with an improved signal-to-noise ratio from the individual second images comprises forming a sum of the respective squares of the brightness values of the corresponding pixels for all of said second individual images, and assigning a brightness value to a corresponding pixel in said second source image dependent on the square root of said sum of the squares.

4. A method as claimed in claim 2 comprising the additional steps of:

forming a noise-reduced intermediate image from said plurality of first individual images and said plurality of second individual images by forming a sum of the respective squares of the brightness values of correlated pixels in all of said first and second individual images, and taking a square root of said sum of the squares;

forming a sensitivity distribution image by referencing said intermediate image to said single, compensated image;

generating a noise-reduced sensitivity distribution image by low-pass filtering said sensitivity distribution image; and generating a noise-reduced, compensated nuclear magnetic resonance image by referencing said noise-reduced intermediate image to said noise-reduced sensitivity distribution image.

5. A method as claimed in claim 2 comprising the additional steps of:

forming a noise-reduced intermediate image from said plurality of first individual images and said plurality of second individual images by forming a sum of the respective squares of the brightness values of correlated pixels in all of said first and second individual images, and taking a square root of said sum of the squares;

respectively low-pass filtering said intermediate image and said single, compensated nuclear magnetic resonance image to obtain a low-pass filtered intermediate image and a low-pass filtered compensated image;

generating a noise-reduced sensitivity distribution image by referencing said low-pass filtered intermediate image to said low-pass filtered compensated image; and generating a noise-reduced, compensated nuclear magnetic resonance image by referencing said intermediate image to said noise-reduced sensitivity distribution image.

6. A method as claimed in claim 1 comprising the additional steps of:

generating a noise-reduced intermediate image from said first and second source images by forming a sum of the respective squares of the brightness values of corresponding pixels in said first and second source images and taking a square root of the sum of the squares;

forming a sensitivity distribution image by referencing said intermediate image to said single, compensated image;

generating a noise-reduced sensitivity distribution image by low-pass filtering said sensitivity distribution image; and generating a noise-reduced, compensated nuclear magnetic resonance image by referencing said noise-reduced intermediate image to said noise-reduced sensitivity distribution image.

7. A method as claimed in claim 1 comprising the additional steps of:

generating a noise-reduced intermediate image from said first and second source images by forming a sum of the respective squares of the brightness values of corresponding pixels in said first and second source images and taking a square root of the sum of the squares;

generating a noise-reduced sensitivity distribution image by referencing said low-pass filtered intermediate image to said low-pass filtered compensated image; and generating a noise-reduced, compensated nuclear magnetic resonance image by referencing said intermediate image to said noise-reduced sensitivity distribution image.

* * * * *